United States Patent
Ikedo et al.

(10) Patent No.: US 10,277,854 B2
(45) Date of Patent: Apr. 30, 2019

(54) IMAGE CAPTURING APPARATUS, CONTROL METHOD THEREFOR, AND STORAGE MEDIUM

(71) Applicant: CANON KABUSHIKI KAISHA, Tokyo (JP)

(72) Inventors: Hideki Ikedo, Kawasaki (JP); Nobuhiro Takeda, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 15/618,375

(22) Filed: Jun. 9, 2017

(65) Prior Publication Data

US 2017/0374309 A1    Dec. 28, 2017

(30) Foreign Application Priority Data

Jun. 22, 2016 (JP) .................................. 2016-123990

(51) Int. Cl.
*H04N 5/378* (2011.01)
*H04N 5/374* (2011.01)
*H01L 27/146* (2006.01)

(52) U.S. Cl.
CPC ............ *H04N 5/378* (2013.01); *H04N 5/374* (2013.01); *H01L 27/14609* (2013.01); *H01L 27/14636* (2013.01); *H01L 27/14643* (2013.01)

(58) Field of Classification Search
CPC .. H04N 5/363; H04N 5/3745–5/37455; H04N 5/378; H04N 5/3355; H03M 1/00–1/645
USPC ................................... 341/155–172; 348/378
See application file for complete search history.

(56) References Cited

U.S. PATENT DOCUMENTS

| | | | |
|---|---|---|---|
| 7,623,173 B2 | 11/2009 | Nitta et al. | |
| 8,570,415 B2 | 10/2013 | Takeda | |
| 8,582,009 B2 | 11/2013 | Kono et al. | |
| 8,692,917 B2 | 4/2014 | Takeda | |
| 9,030,589 B2 | 5/2015 | Sasaki et al. | |
| 2011/0170603 A1* | 7/2011 | Sato ........................ | H04N 19/61 375/240.16 |
| 2012/0086824 A1* | 4/2012 | Asakura ............. | H04N 5/23258 348/208.99 |

(Continued)

FOREIGN PATENT DOCUMENTS

JP    2005-278135 A    10/2005

OTHER PUBLICATIONS

U.S. Appl. No. 15/604,919, filed May 25, 2017 (First Named Inventor: Hirokazu Kobayashi).

*Primary Examiner* — Xi Wang
(74) *Attorney, Agent, or Firm* — Venable LLP

(57) ABSTRACT

An image capturing apparatus includes: pixels that are arranged in a matrix and each include a photoelectric conversion portion; a column output line; an AD converter; a setting unit that sets a first driving mode for causing the AD converter to convert the analog signals into the digital signals with a resolution of n bits, or a second driving mode for causing the AD converter to convert the analog signals into the digital signals with a resolution of m bits; and a controller that controls an operation period, which extends from a start of outputting of the analog signals to a start of an operation of converting the analog signals into the digital signals, to be shorter when the setting unit has set the second driving mode than when the first driving mode has been set.

8 Claims, 15 Drawing Sheets

(56) References Cited

U.S. PATENT DOCUMENTS

| | | | |
|---|---|---|---|
| 2013/0271633 A1* | 10/2013 | Hashimoto | H04N 5/353 348/300 |
| 2016/0141327 A1* | 5/2016 | Verdant | H01L 27/14612 250/208.1 |
| 2017/0111599 A1 | 4/2017 | Saito et al. | |
| 2017/0142359 A1 | 5/2017 | Ikedo | |

* cited by examiner

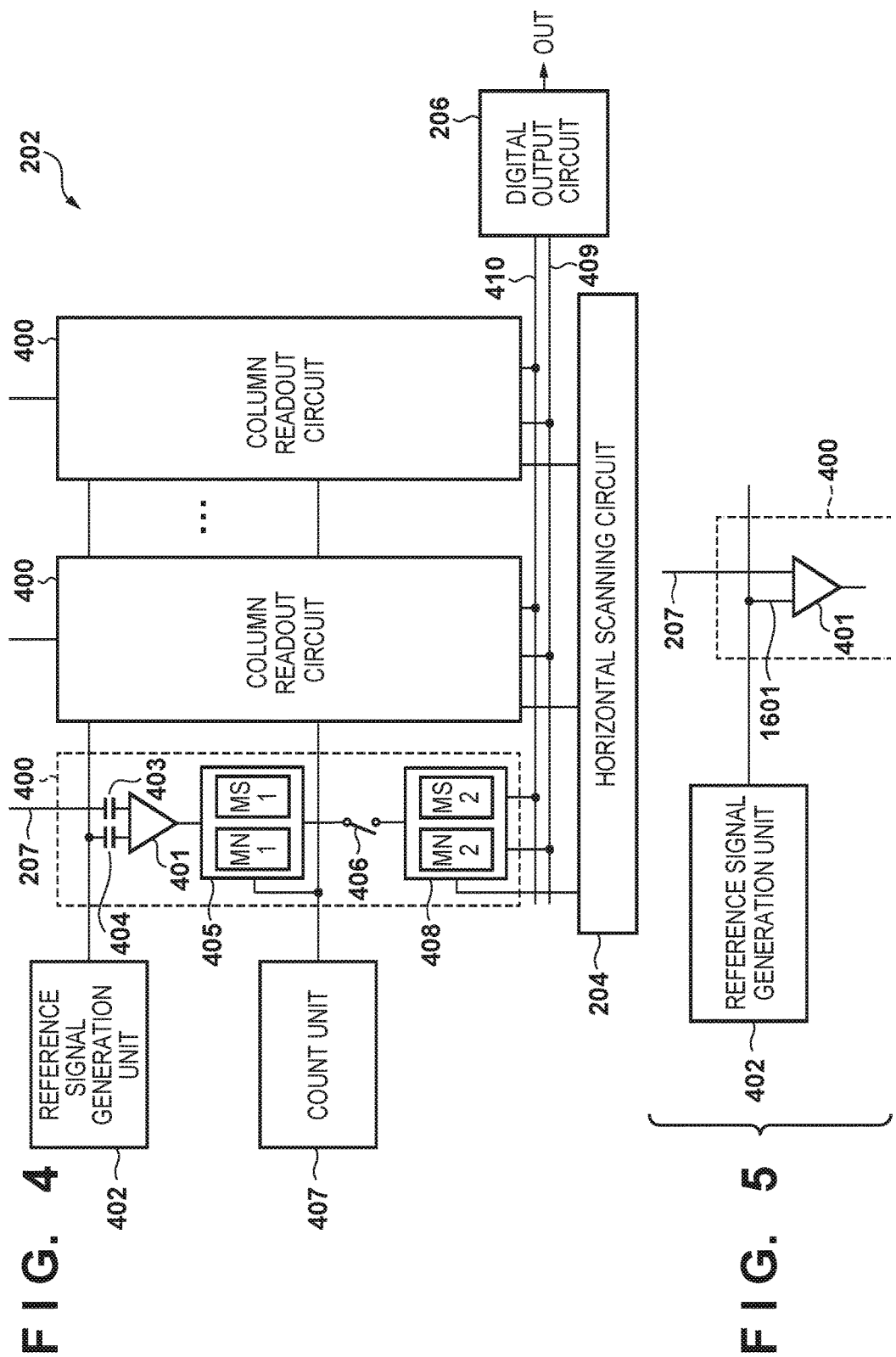

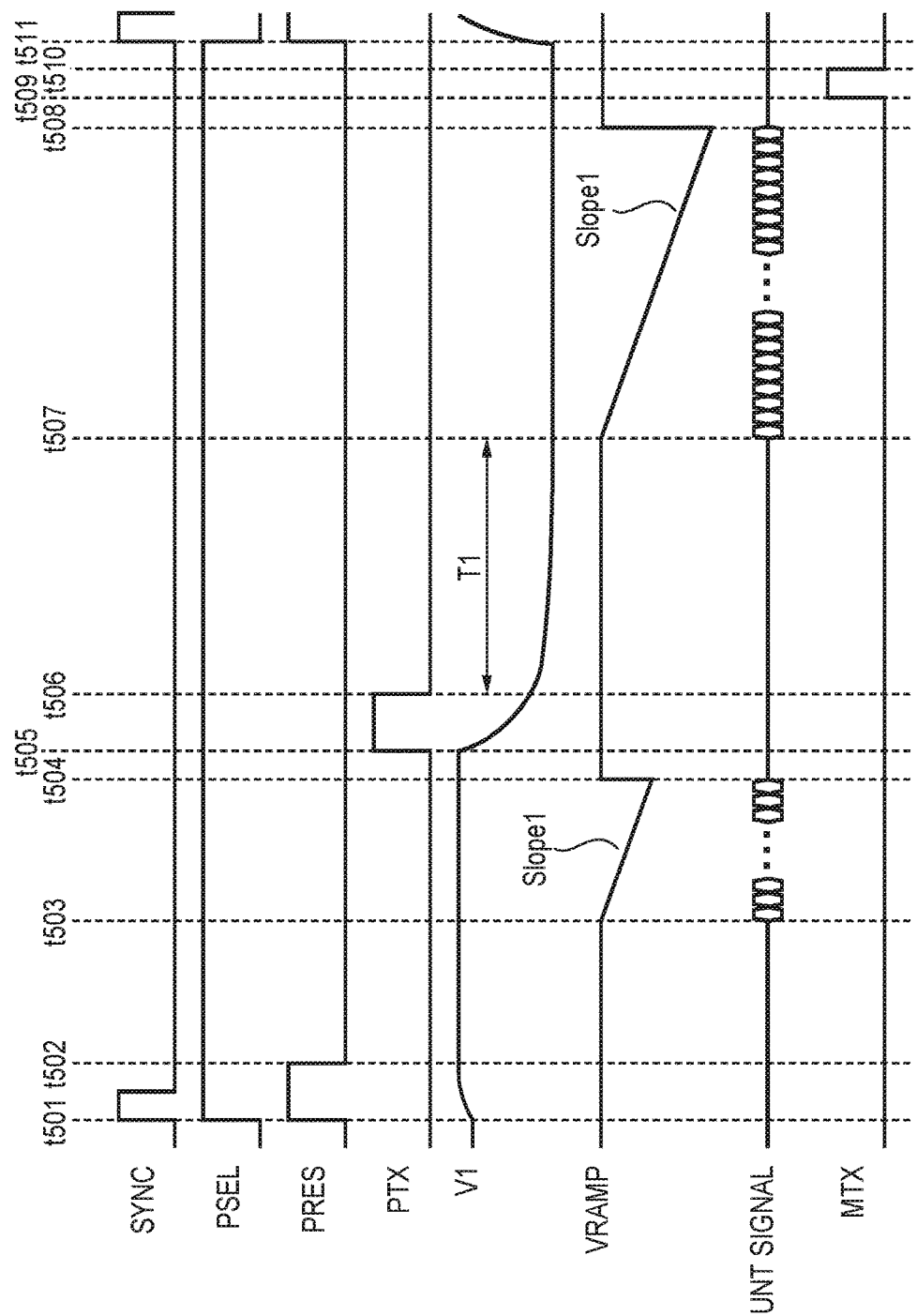

IMAGE CAPTURING APPARATUS, CONTROL METHOD THEREFOR, AND STORAGE MEDIUM

BACKGROUND OF THE INVENTION

Field of the Invention

The present invention relates to an image capturing apparatus and a control method therefor.

Description of the Related Art

In recent years, functionalities of CMOS image sensors used in digital still cameras, digital video cameras, and other image capturing apparatuses are becoming increasingly sophisticated. Japanese Patent Laid-Open No. 2005-278135 discloses an image capturing apparatus including a circuit that performs analog-to-digital conversion (hereinafter, "AD conversion") on a column-by-column basis. The image capturing apparatus described in Japanese Patent Laid-Open No. 2005-278135 reads out signals of pixels arranged in a matrix on a row-by-row basis via column output lines that are provided in one-to-one correspondence with columns, converts the signals into digital signals using AD conversion circuits that are provided in one-to-one correspondence with columns, and outputs the digital signals to the outside of the image capturing apparatus.

Normally, AD conversion with a high resolution of 12 bits to 14 bits is applied to images captured by a digital camera, and the resultant images are recorded as digital signals. On the other hand, during, for example, an inspection of an image sensor in a camera assembly process and the like, captured images may be converted into binary digital signals and output. In this case, it is desirable that the camera can output the binary digital signals at high speed to shorten an inspection period.

SUMMARY OF THE INVENTION

The present invention has been made in view of the above issues, and enables an image capturing apparatus having an AD conversion circuit to output low-resolution digital signals at high speed.

According to one aspect of the present invention, there is provided an image capturing apparatus, comprising: a plurality of pixels arranged in a matrix, each pixel including a photoelectric conversion portion; a column output line to which the plurality of pixels output analog signals on a column-by-column basis; an AD converter that converts the analog signals output from the plurality of pixels via the column output line into digital signals; a setting unit that sets one of a first driving mode and a second driving mode, the first driving mode causing the AD converter to convert the analog signals into the digital signals with a resolution of n bits, the second driving mode causing the AD converter to convert the analog signals into the digital signals with a resolution of m bits, n being an integer larger than or equal to two, m being a positive integer smaller than n; and a controller that performs control to make an operation period shorter when the setting unit has set the second driving mode than when the setting unit has set the first driving mode, the operation period being a period from a start of the outputting of the analog signals from the plurality of pixels to the column output line to a start of an operation of converting the analog signals into the digital signals in the AD converter.

According to another aspect of the present invention, there is provided a method of controlling an image capturing apparatus including a plurality of pixels arranged in a matrix, a column output line to which the plurality of pixels output analog signals on a column-by-column basis, and an AD converter that converts the analog signals output from the plurality of pixels via the column output line into digital signals, each pixel including a photoelectric conversion portion, the method comprising: setting one of a first driving mode and a second driving mode, the first driving mode causing the AD converter to convert the analog signals into the digital signals with a resolution of n bits, the second driving mode causing the AD converter to convert the analog signals into the digital signals with a resolution of m bits, n being an integer larger than or equal to two, m being a positive integer smaller than n; and performing control to make an operation period shorter when the second driving mode is set than when the first driving mode is set in the setting, the operation period being a period from a start of the outputting of the analog signals from the plurality of pixels to the column output line to a start of an operation of converting the analog signals into the digital signals in the AD converter.

Further features of the present invention will become apparent from the following description of exemplary embodiments with reference to the attached drawings.

BRIEF DESCRIPTION OF THE DRAWINGS

FIG. 4 shows a detailed configuration of a readout circuit in the image sensor.

FIG. 5 shows an exemplary configuration of comparison units for a case in which storage capacitors are not provided.

FIG. 6 is a timing chart showing driving for readout in a first driving mode.

DESCRIPTION OF THE EMBODIMENTS

The following describes embodiments of the present invention in detail with reference to the attached drawings.

First Embodiment

Figure 1:
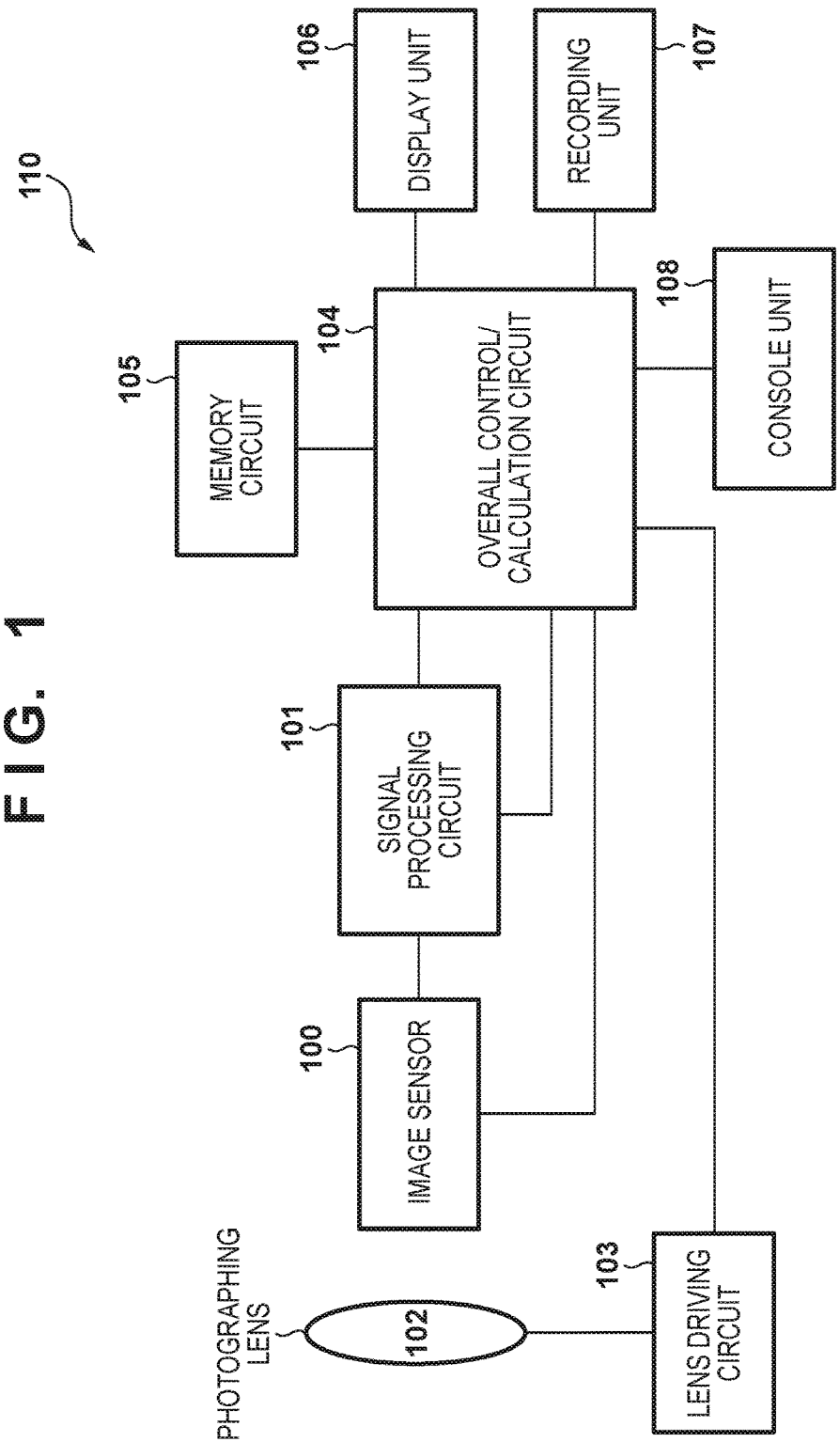
FIG. 1 is a block diagram showing a configuration of an image capturing apparatus according to a first embodiment of the present invention.

FIG. 1 is a block diagram showing a configuration of an image capturing apparatus 110 according to a first embodiment of the present invention. In FIG. 1, an image sensor 100 outputs image signals by photoelectrically converting an object image formed by a photographing lens 102. The photographing lens 102 forms an optical image of an object on the image sensor 100. A lens driving circuit 103 performs zooming control, focusing control, diaphragm control, and so forth with respect to the photographing lens 102. A signal processing circuit 101 applies various types of correction to signals output from the image sensor 100. An overall control/calculation circuit 104 performs various types of calculation, and controls an entirety of the image capturing apparatus 110. A memory circuit 105 temporarily stores image data. A display unit 106 displays various types of information and captured images. A recording unit 107 is configured to allow, for example, a semiconductor memory used in recording or readout of image data to be removably attached thereto. A console unit 108 is composed of buttons, dials, and so forth, and accepts operations input by a user. When the display unit 106 includes a touchscreen, the touchscreen composes the console unit 108 as well.

The image capturing apparatus according to the present embodiment has a first driving mode for outputting image signals after applying thereto AD conversion with a resolution of 12 bits (n bits, where n is an integer larger than or equal to 2), and a second driving mode for outputting image signals after applying thereto AD conversion with a resolution of 1 bit (m bit, where m is a positive integer smaller than n). The overall control/calculation circuit 104 can set one of these first driving mode and second driving mode.

Figure 2:
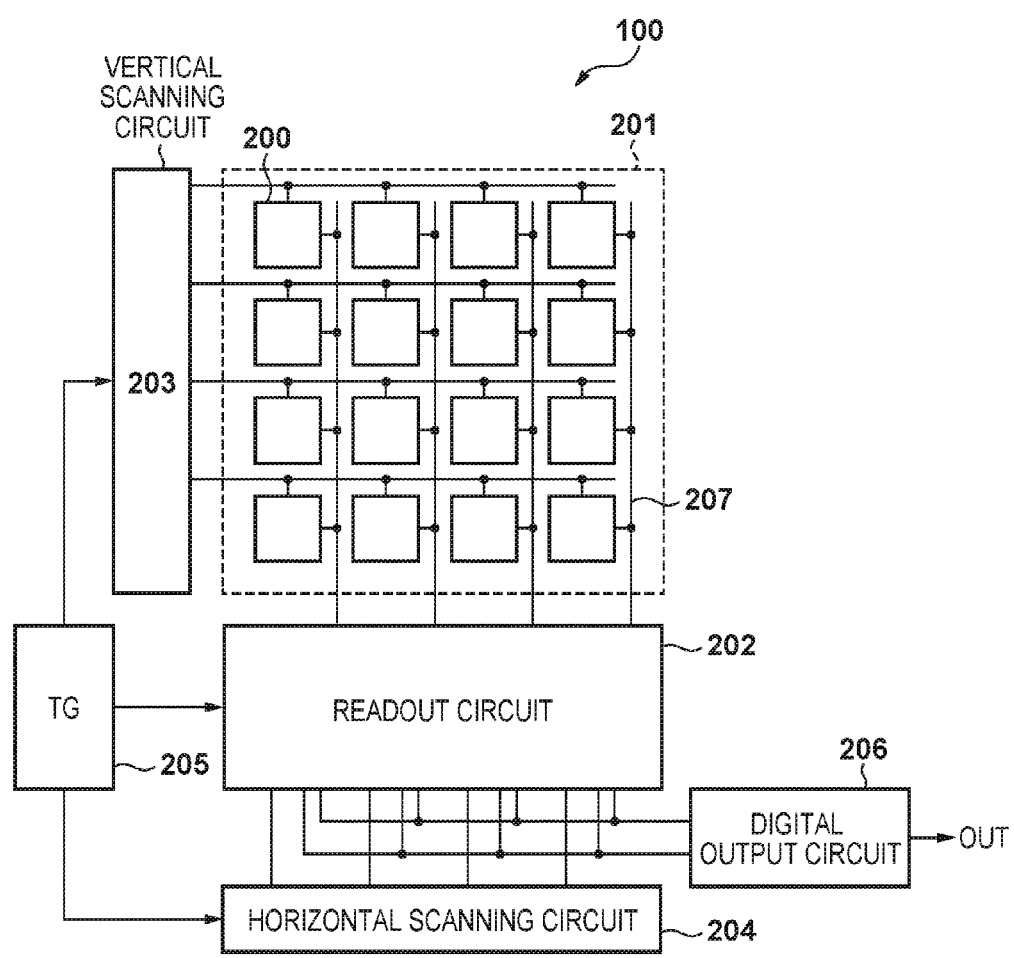
FIG. 2 shows an overall configuration of an image sensor.

A configuration of the image sensor 100 will now be described using FIGS. 2 to 4. FIG. 2 shows an overall configuration of the image sensor 100. The image sensor 100 is composed of a pixel area 201, a readout circuit 202, a vertical scanning circuit 203, a horizontal scanning circuit 204, a timing generation circuit (hereinafter, "TG") 205, and a digital output circuit 206.

In the pixel area 201, unit pixels 200 are arranged in a matrix. Although a four-by-four pixel array is illustrated for ease of comprehension, a much larger number of pixels are arrayed in practice. Each column of pixels (each group of pixels aligned in a column direction) is connected to the readout circuit 202 via a corresponding one of column output lines 207.

The vertical scanning circuit 203 selects the pixels arrayed in the pixel area 201 on a row-by-row basis, and transmits a driving signal to pixels in a selected row. Via the column output lines 207, the pixels output analog pixel signals on a row-by-row basis to the readout circuit 202, which converts the analog pixel signals into digital signals through AD conversion on a row-by-row basis. The converted digital signals are sequentially output to the digital output circuit 206 based on horizontal scanning pulses from the horizontal scanning circuit 204.

The timing generator (hereinafter, "TG") 205 transmits timing signals for controlling the readout circuit 202, vertical scanning circuit 203, and horizontal scanning circuit 204. The digital output circuit 206 applies correction processing and the like to the digital signals output from the readout circuit 202, and outputs the resultant digital signals to the outside of the image sensor.

Figure 3:
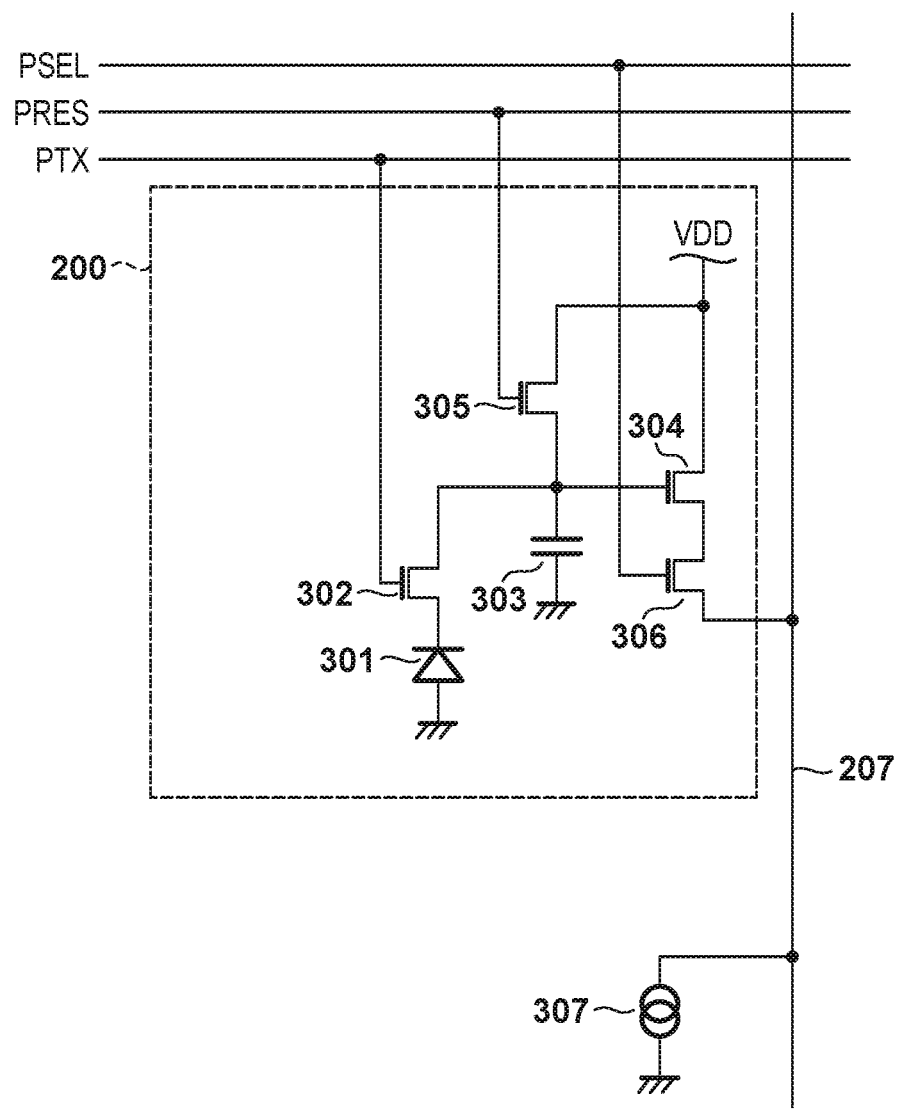
FIG. 3 shows a configuration of unit pixels in the image sensor.

FIG. 3 shows a configuration of the unit pixels 200. As shown in FIG. 3, each unit pixel 200 is composed of a photodiode 301, a transfer switch (transfer unit) 302, a floating diffusion unit (hereinafter, "FD") 303, an amplification unit 304, a reset switch (reset unit) 305, and a selection switch 306.

The photodiode 301 functions as a photoelectric conversion portion that receives light incident via the photographing lens and generates signal charges corresponding to an amount of the received light. The transfer switch 302 transfers the charges generated by the photodiode 301 to the FD 303. The transfer switch 302 is controlled by a transfer pulse signal PTX. The FD 303 functions as a charge-to-voltage converter that temporarily stores the signal charges transferred from the photodiode 301 and converts the stored charges into a voltage signal. Serving as an amplification transistor, the amplification unit 304 amplifies the voltage signal, which is based on the charges stored in the FD 303, and outputs the amplified voltage signal as a pixel signal. The amplification transistor, which constitutes the amplification unit 304, forms a source follower together with a current supply 307 connected to the corresponding column output line 207.

Under control of a reset pulse signal PRES, the reset switch 305 resets the potential of the FD 303 to a reference potential VDD. Under control of a vertical selection pulse signal PSEL, the selection switch 306 outputs the pixel signal amplified by the amplification unit 304 to the column output line 207.

FIG. 4 shows a detailed configuration of the readout circuit 202. As shown in FIG. 4, the readout circuit 202 includes a reference signal generation unit 402, a count unit 407, and column readout circuits 400 that are provided in one-to-one correspondence with columns. As the column readout circuits 400 of different columns are configured in the same manner, the figure shows a detailed configuration of only one of them corresponding to one column. Each column readout circuit 400 is composed of storage capacitors 403 and 404, a comparison unit 401, a writing memory 405, a memory-to-memory transfer switch 406, and a readout memory 408.

The comparison unit 401 and the writing memory 405 form an AD conversion circuit (AD converter) together with the reference signal generation unit 402 and the count unit 407. Pixel signals that have been simultaneously read out from a row via the column output lines 207 of different columns are converted into digital signals in this AD conversion circuit on a row-by-row basis.

An analog pixel signal output from each column output line 207 is input to the comparison unit 401 via the storage capacitor 403. The reference signal generation unit 402 generates a reference signal VRAMP that changes in potential with time, and the generated reference signal is input to the comparison unit 401 via the storage capacitor 404. The storage capacitors 403 and 404 are reset by a non-illustrated reset switch. A switch may be provided between the storage capacitor 403 and the column output line 207 to cut off connection to the column output line 207 after the pixel signal is stored to the storage capacitor 403.

The comparison unit 401 compares the reference signal VRAMP with the pixel signal output from the column output line 207, and outputs a latch signal, which is based on a comparison result, when the magnitude relationship between the signal level of the reference signal VRAMP and the signal level of the pixel signal is reversed. The count unit 407 generates a count signal composed of a plurality of bits by measuring the number of counts in a non-illustrated internal clock at a timing when the reference signal generation unit 402 starts changing the potential of the reference signal VRAMP. The generated count signal is input to the writing memory 405 of each column. Upon receiving the latch signal input from the comparison unit 401, the writing memory 405 stores the count signal that is supplied from the count unit 407 at that time as a digital signal. The writing memory 405 includes two memories MN1 and MS1 composed of a plurality of bits. The memory MS1 stores a later-described S signal, which is an optical signal, as a digital signal, whereas the memory MN1 stores a later-described N signal, which is a reset signal, as a digital signal.

The digital signals stored in the memories MS1 and MN1 are transferred to the readout memory 408 via the memory-to-memory transfer switch 406. The readout memory 408 includes two memories MN2 and MS2 composed of a plurality of bits. The N signal stored in the memory MN1 is transferred to the memory MN2. The S signal stored in the memory MS1 is transferred to the memory MS2. Horizontal scanning pulses from the horizontal scanning circuit 204 cause the digital signals stored in the memories MN2 and MS2 to be output to the digital output circuit 206 via digital output lines 409 and 410. The digital output circuit 206 executes processing for subtracting the N signal from the S signal, and outputs the resultant signal to the outside of the image sensor.

Amplifiers may be provided in a stage preceding the column readout circuits 400, in which case AD conversion may be performed after amplifying the analog signals output via the column output lines 207. Storage capacitors may not be provided between the comparison units 401 and the column output lines 207. FIG. 5 shows an exemplary configuration of the comparison units 401 for a case in which the storage capacitors 403 and 404 are not provided. In this case, signals from the column output lines 207 are input directly to the comparison units 401 without passing through the storage capacitors. Furthermore, a wire 1601 for supplying the VRAMP signal from the reference signal generation unit 402 is connected directly to the comparison units 401 without passing through the storage capacitors.

Figure 7:
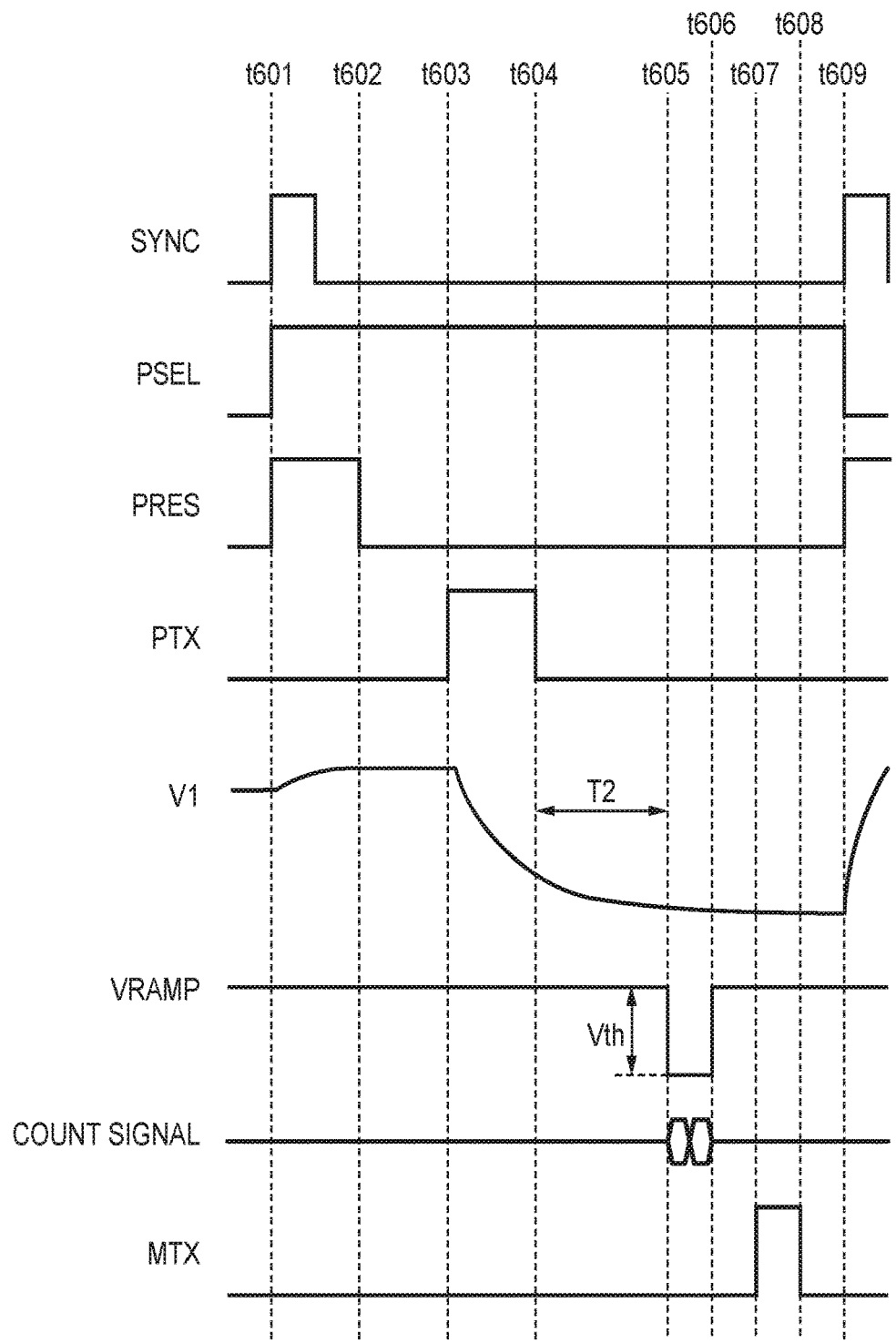
FIG. 7 is a timing chart showing driving for readout in a second driving mode.

A description is now given of a method of driving the image capturing apparatus according to the present embodiment using FIGS. 6 and 7. The image capturing apparatus according to the present embodiment has the first driving mode for outputting pixel signals after applying thereto AD conversion with a resolution of 12 bits, and the second driving mode for outputting pixel signals after applying thereto AD conversion with a resolution of 1 bit.

FIG. 6 is a timing chart showing timings of operations in the first driving mode. Specifically, FIG. 6 is a timing chart showing driving for readout from a certain row selected by the vertical scanning circuit 203. Placing each control signal at the high (H) level turns ON a corresponding one of the switches shown in FIGS. 3 and 4. V1 denotes the potential of the column output lines 207.

First, at time t501, a horizontal synchronization pulse signal SYNC is placed at the H level. Also, the vertical selection pulse signal PSEL for the selected row is placed at the H level, and the selection switches 306 of pixels in the selected row are turned ON. As a result, the pixels in the selected row are connected to the column output lines 207. At the same time, the reset pulse signal PRES is placed at the H level, the reset switches 305 of the pixels are turned ON, and the FDs 303 of the pixels are reset. At this time, the potentials of the storage capacitors 403 and 404 shown in FIG. 4 are also reset by a non-illustrated reset switch.

Then, at time t502, the reset pulse signal PRES is placed at the low (L) level, and thus the reset switches 305 are turned OFF. At this time, the potential V1 of the column output lines 207 is the potential attained upon cancellation of the resetting of the FD 303. Pixel signals output to the column output lines 207 at this time are reset level signals, which will be referred to as N signals.

After the potential V1 of the column output lines 207 has stabilized at the level of the N signals, an operation of converting the N signals stored in the storage capacitors 403 into digital signals is started at time t503. At time t503, the VRAMP signal supplied from the reference signal generation unit 402 starts changing with time at an inclination of Slope1. The comparison units 401 start an operation of comparing the N signals input via the storage capacitors 403 with the VRAMP signal supplied from the reference signal generation unit 402 via the storage capacitors 404. Between time t503 and time t504, the count unit 407 performs a count operation corresponding to 8 bits, and supplies an 8-bit count signal to the writing memories 405. When the magnitude relationship between the N signals and the VRAMP signal is reversed, the comparison units 401 output the latch signal to the writing memories 405. At this time, the 8-bit count signal supplied to the writing memories 405 is stored as digital N signals to the memories MN1. At time t504, the VRAMP signal stops changing with time, and the count unit 407 stops the count operation. The foregoing operations performed from time t503 to time t504 to convert the N signals into the digital signals will be referred to as N conversion.

Then, from time t505 to time t506, the transfer pulse signal PTX is placed at the H level. Accordingly, the transfer switches 302 of the pixels shown in FIG. 3 are turned ON, and signal charges generated by the photodiodes 301 through photoelectric conversion are transferred to the FDs 303. Optical signals corresponding to the amounts of charges generated by the photodiodes 301 are output to the column output lines 207. These optical signals will be referred to as S signals. The potential V1 of the column output lines 207 starts changing from the level of the N signals to the level of the S signals.

After a stabilization period T1 has elapsed, an operation of converting the S signals stored in the storage capacitors 403 into digital signals is started at time t507. At time t507, the VRAMP signal supplied from the reference signal generation unit 402 starts changing with time at an inclination of Slope1, similarly to the case of the N conversion. The comparison units 401 start an operation of comparing the S signals input via the storage capacitors 403 with the VRAMP signal supplied from the reference signal generation unit 402 via the storage capacitors 404. Between time t507 and time t508, the count unit 407 performs a count operation corresponding to 12 bits at the same operating frequency as the N conversion, and outputs a 12-bit count signal to the writing memories 405. When the magnitude relationship between the S signals and the VRAMP signal is reversed, the comparison units 401 output the latch signal to the writing memories 405. At this time, the 12-bit count signal supplied to the writing memories 405 is stored as digital S signals to the memories MS1. The foregoing operations performed from time t507 to time t508 to convert the S signals into the digital signals will be referred to as S conversion. This S conversion is performed with a resolution of 12 bits.

In the N conversion between time t503 and time t504, the count unit 407 performs the count operation corresponding to 8 bits, which is different from the count operation performed in the S conversion. This is because the N signals are composed mainly of noise components and offset components, and thus have a smaller signal range than the S signals. As the VRAMP signal has the same inclination and the count operation is performed at the same frequency in the N conversion and the S conversion, the resolution of the N conversion is the same as the resolution of the S conversion, that is, 12 bits. The digital output circuit 206 executes processing for subtracting the N signals from the S signals (hereinafter, "S-N processing"), and finally outputs signals with a resolution of 12 bits.

From time t509 to time t510, a transfer pulse signal MTX is placed at the H level. Accordingly, the memory-to-memory transfer switches 406 shown in FIG. 4 are turned ON, and the digital N signals and the digital S signals stored in the memories MN1 and MS1 of the writing memories 405 are transferred to the memories MN2 and MS2 of the readout memories 408, respectively. The operations from time t501 to time t510 will be referred to as vertical transfer. At time t511, the horizontal synchronization pulse signal SYNC is placed at the H level again, and vertical transfer for the next row is started.

The digital N signals and the digital S signals stored in the memories MN2 and MS2 of different columns are sequentially output to the digital output circuit 206 in a period of vertical transfer for the next row. This sequential output operation will be referred to as horizontal transfer. In horizontal transfer, the horizontal scanning circuit 204 transmits horizontal scanning pulses, and the digital N signals and the digital S signals stored in the memories MN2 and MS2 of different columns are sequentially output on a column-by-column basis to the digital output circuit 206 via the digital output lines 409 and 410, respectively. This scanning is repeated until the last column, and then outputting of the S signals and N signals corresponding to one row is completed. This horizontal transfer is performed at an operating frequency that enables the horizontal transfer to be completed within the period of vertical transfer for the next row.

The S signals and N signals output to the digital output circuit 206 sequentially undergo the S-N processing, and fixed pattern noise is removed therefrom. The resultant signals from which the fixed pattern noise has been removed are output to the outside of the image sensor.

Using FIG. 7, the following describes timings of driving in the second driving mode for outputting pixel signals after applying thereto AD conversion of with a resolution of 1 bit. Specifically, FIG. 7 is a timing chart showing driving for readout from a certain row selected by the vertical scanning circuit 203. The operations from time t601 to time t602 are similar to the operations from time t501 to time t502 in the first driving mode, which have been described using FIG. 6, and thus a description thereof will be omitted.

The resetting is cancelled at time t602, and once the potential V1 of the column output lines 207 has been stabilized, readout of S signals is started at time t603. The N conversion performed in the first driving mode is skipped here, the reason for which will be described later. From time t603 to time t604, the transfer switches 302 of the pixels are turned ON by placing the transfer pulse signal PTX at the H level. Accordingly, signal charges generated by the photodiodes 301 through photoelectric conversion are transferred to the FDs 303. The S signals are output to the column output lines 207, and the potential V1 of the column output lines 207 starts changing to the level of the S signals. After a stabilization period T2 has elapsed, an operation of converting the S signals stored in the storage capacitors 403 into digital signals is started at time t605.

At time t605, the reference signal generation unit 402 supplies a VRAMP signal that has an offset of a threshold Vth from a default value and that does not change with time. The comparison units 401 start an operation of comparing the S signals input via the storage capacitors 403 with the VRAMP signal supplied from the reference signal generation unit 402 via the storage capacitors 404. Between time t605 and time t606, the count unit 407 performs a count operation corresponding to 1 bit using 0 and 1, and outputs a 1-bit count signal to the writing memories 405. If the potential of the VRAMP signal is lower than V1 at the start of the comparison operation, the comparison units 401 immediately output the latch signal, and a value of 0 corresponding to the start of counting is stored to the memories MS1. If the potential of the VRAMP signal is higher than V1, the comparison units 401 do not output the latch signal; in this case, after the count operation is ended at time t606, the latch signal is mandatorily input to the memories MS1, and a value of 1 is stored. Therefore, using the threshold Vth as a borderline, the analog S signals can be converted into 1-bit (binary) digital signals. Furthermore, as AD conversion is performed with a low resolution, a period required for the S conversion between time t605 and time t606 can be shortened compared with the first driving mode.

From time t607 to time t608, the transfer pulse signal MTX is placed at the H level. Accordingly, the memory-to-memory transfer switches 406 are turned ON, and the digital S signals stored in the memories MS1 of the writing memories 405 are transferred to the memories MS2 of the readout memories 408.

Thereafter, at time t609, the horizontal synchronization pulse signal SYNC is placed at the H level again, and vertical transfer for the next row is started, similarly to the first driving mode. The digital S signals stored in the memories MS2 of different columns are sequentially output to the digital output circuit 206 through horizontal transfer in a period of vertical transfer for the next row. This horizontal transfer is performed at an operating frequency that enables the horizontal transfer to be completed within the period of vertical transfer for the next row. The digital output circuit 206 outputs the S signals to the outside of the image sensor as-is without executing the S-N processing.

Figure 8:
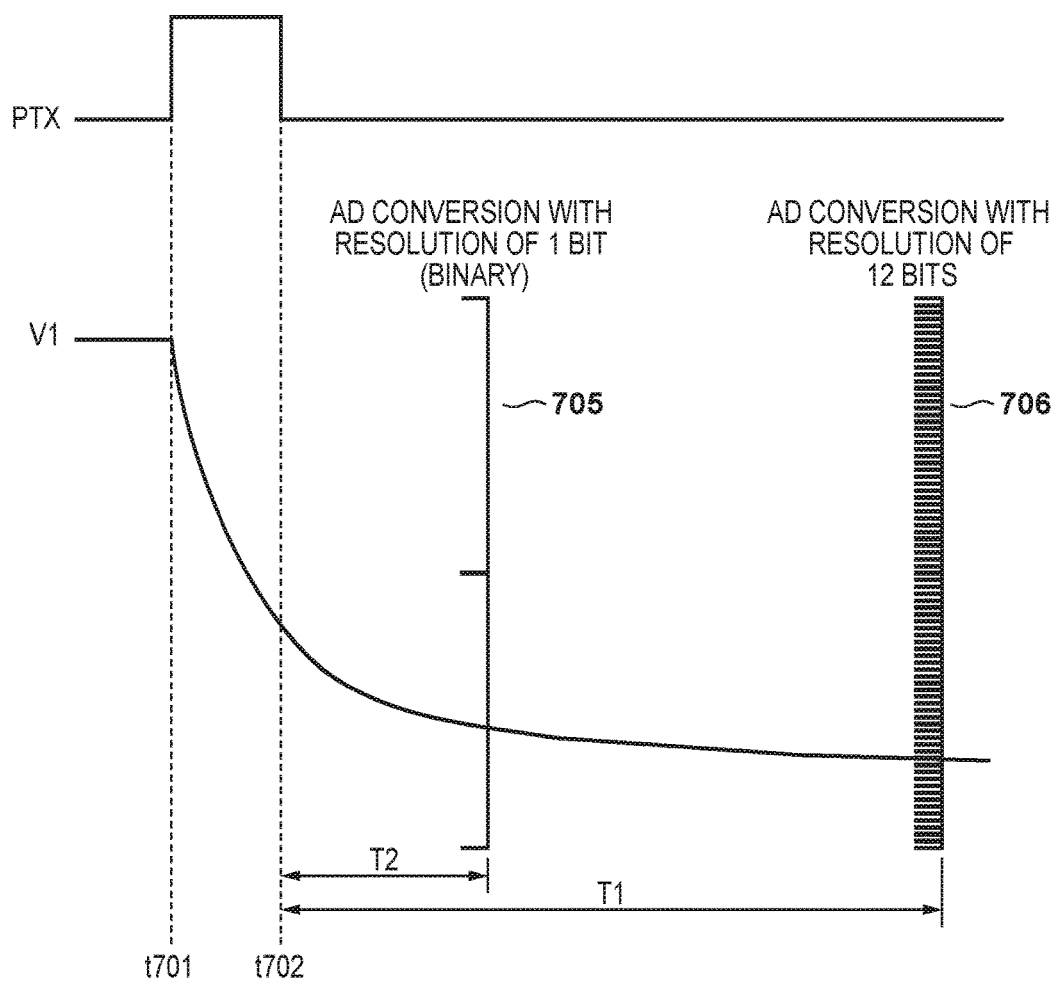
FIG. 8 shows a change in the potential of column output lines.

In the second driving mode, the stabilization period T2 for the column output lines 207 is short compared with the first driving mode. The reason therefor will now be described using FIG. 8. FIG. 8 shows a change in the potential V1 of the column output lines when the S signals are output to the column output lines 207 by placing the transfer pulse signal PTX at the H level. This corresponds to time t505 to time t507 in FIG. 6, and time t603 to time t605 in FIG. 7.

The potential V1 of the column output lines changes roughly as shown in FIG. 8, although the change varies depending on the parasitic resistance and parasitic capacitance of the column output lines 207, an amount of constant current of the current supply 307, and the like. Specifically, the potential V1 suddenly changes immediately after the transfer pulse signal PTX is placed at the H level at time t701, and then gradually changes and enters a steady state. Now, AD conversion 706 with a resolution of 12 bits and AD conversion 705 with a resolution of 1 bit will be compared with each other, assuming that a signal having the potential V1 is the target of the AD conversions. An allowable error (an allowable amount of difference from the steady state) to be set for the potential V1 needs to be smaller in the AD conversion with a resolution of 12 bits than in the other AD conversion. Therefore, the stabilization period after the transfer pulse signal PTX is placed at the L level at time t702 can be set to satisfy the relationship T2<T1. For this reason, compared with the first driving mode, the second driving mode for performing AD conversion with a resolution of 1 bit can shorten an operation period from when the S signals are output to the column output lines 207 to when AD conversion of the S signals stored in the storage capacitors is started. Furthermore, a stabilization period for the column output lines 207 that extends from time t602 to time t603 after cancellation of the resetting in FIG. 7 can be shorter than a corresponding period from time t502 to time t503 in the first driving mode in FIG. 6.

In the second driving mode for performing AD conversion with a resolution of 1 bit, the image quality need not be as high as the image quality in the first driving mode for performing AD conversion with a resolution of 12 bits. For this reason, the N conversion is not executed, and a readout period is further shortened. As the S-N processing is not executed, offset components differ from offset components obtained when the S-N processing is executed; however, it is sufficient to set the threshold Vth for binarization shown in FIG. 7 in consideration of an amount of difference.

As described above, in the second driving mode, as AD conversion is performed with a lower resolution than AD conversion performed in the first driving mode, the period of the S conversion can be shortened, the stabilization period for the column output lines can be shortened, and the period until the start of AD conversion can be shortened. Therefore, digital signals with a low resolution can be output at high speed.

When the image capturing apparatus performs normal image capture, the first driving mode is used to output digital signals with a high resolution; on the other hand, for example, in an inspection for defects in the image sensor and dust adhering to the image sensor in a process for assembling the image capturing apparatus, the second driving mode is used. In this way, digital signals with a low resolution can be output at high speed, and an inspection period can be shortened.

In the case of the configuration shown in FIG. 5 in which the storage capacitors are not provided between the comparison units 401 and the column output lines 207, after the potential V1 of the column output lines 207 is stabilized at time t507 of FIG. 6 and time t605 of FIG. 7, the comparison units 401 may directly compare the S signals with the VRAMP signal without storing the S signals.

Second Embodiment

In the first embodiment, the period of vertical transfer is shortened by shortening the stabilization period in the second driving mode for performing AD conversion with a resolution of 1 bit. This makes it necessary to shorten the period of horizontal transfer, which is performed in parallel with vertical transfer, and to increase the operating frequency of horizontal transfer. In contrast, a second embodiment introduces a configuration that can accelerate the speed of horizontal transfer without increasing the operating frequency of horizontal transfer. In the present embodiment, horizontal transfer is performed at high speed in the second driving mode by performing collective horizontal transfer of pieces of digital data corresponding to a plurality of rows after AD conversion with a resolution of 1 bit.

Figure 9:
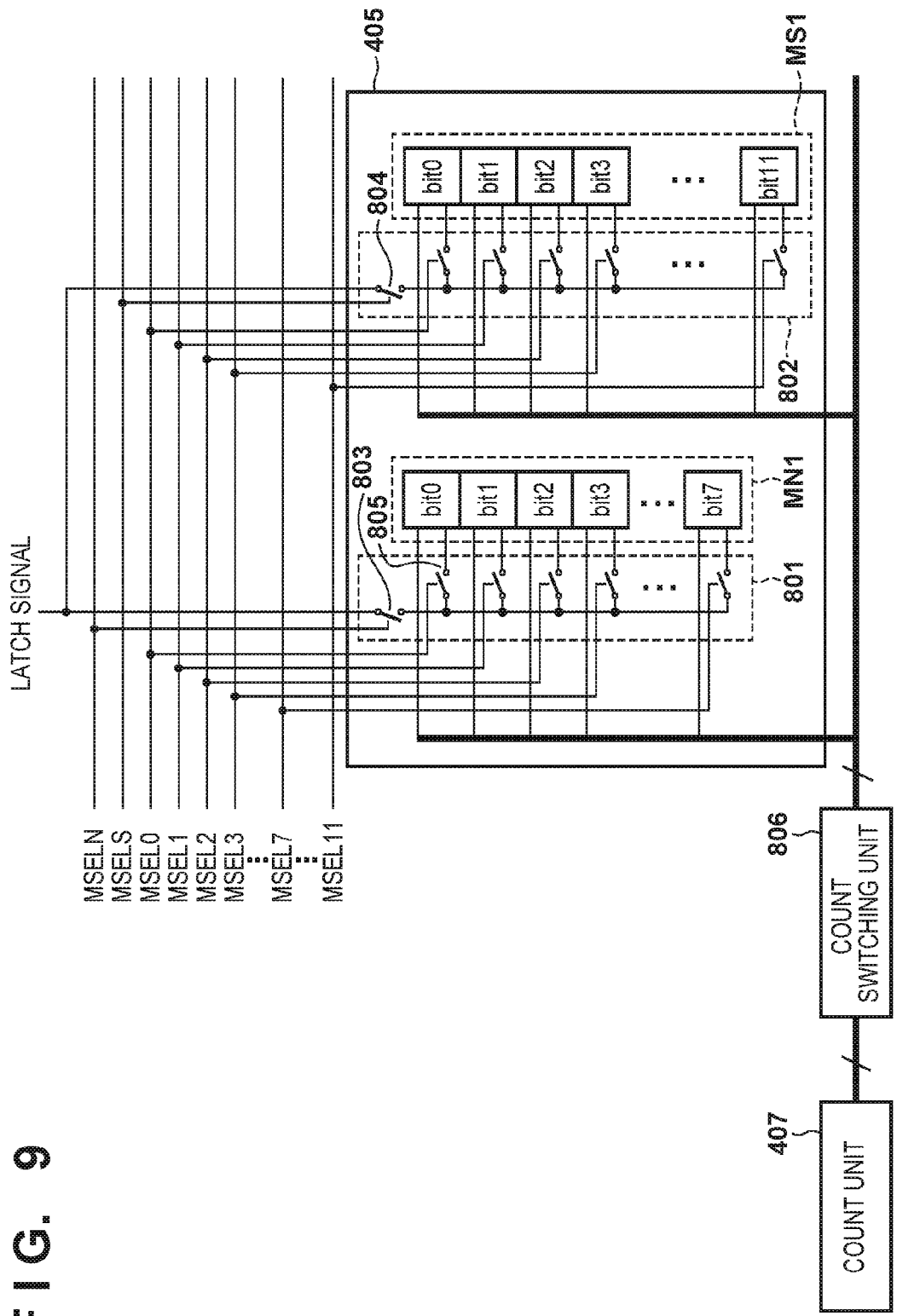
FIG. 9 shows configurations of writing memories and a count unit according to a second embodiment.

FIG. 9 shows configurations of a writing memory 405 and a count unit 407 of the image capturing apparatus according to the second embodiment. The configurations shown in FIG. 9 correspond to the writing memory 405 and the count unit 407 shown in FIG. 4; as the configurations of other components are similar to those according to the first embodiment, a description thereof will be omitted.

A memory MN1 for storing N signals is composed of 8 bits, specifically, bit0 to bit7, and a memory MS1 for storing S signals is composed of 12 bits, specifically, bit0 to bit11. The numbers of bits composing the memories are examples, and the memories may be composed of other numbers of bits.

Latch signal selection units 801 and 802 each select a memory to which a latch signal output from the comparison unit 401 shown in FIG. 4 is to be supplied. A switch 803 is intended to supply the latch signal to the memory MN1, and driven by a selection signal MSELN. A switch 804 is intended to supply the latch signal to the memory MS1, and driven by a selection signal MSELS. Switches 805 are provided in one-to-one correspondence with the bits of the memories MN1 and MS1, and perform a switching operation related to the supply of the latch signal on a bit-by-bit basis. The switches 805 provided in one-to-one correspondence with the bits are driven by selection signals MSEL0 to MSEL11, respectively. For example, when the selection signals MSELN and MSEL0 to MSEL7 are all at the H level, the switch 803, as well as the switches 805 provided in one-to-one correspondence with bits of the memory MN1, is ON, and the latch signal supplied from the comparison unit 401 is supplied to each bit of the memory MN1.

The count unit 407 supplies a multiple-bit count signal to the bits of the memories MN1 and MS1 via a count switching unit 806. Upon receiving the supplied latch signal, each bit of the memories MN1 and MS1 stores the count signal at that time as a digital signal.

The count switching unit 806 switches among the bits of the writing memory 405 to which the multiple-bit count signal output from the count unit 407 is to be supplied. The digital signals stored in the memories MN1 and MS1 are collectively transferred to the memories MS2 and MN2 of the readout memory 408 via the memory-to-memory transfer switch 406 shown in FIG. 4.

Figure 10:
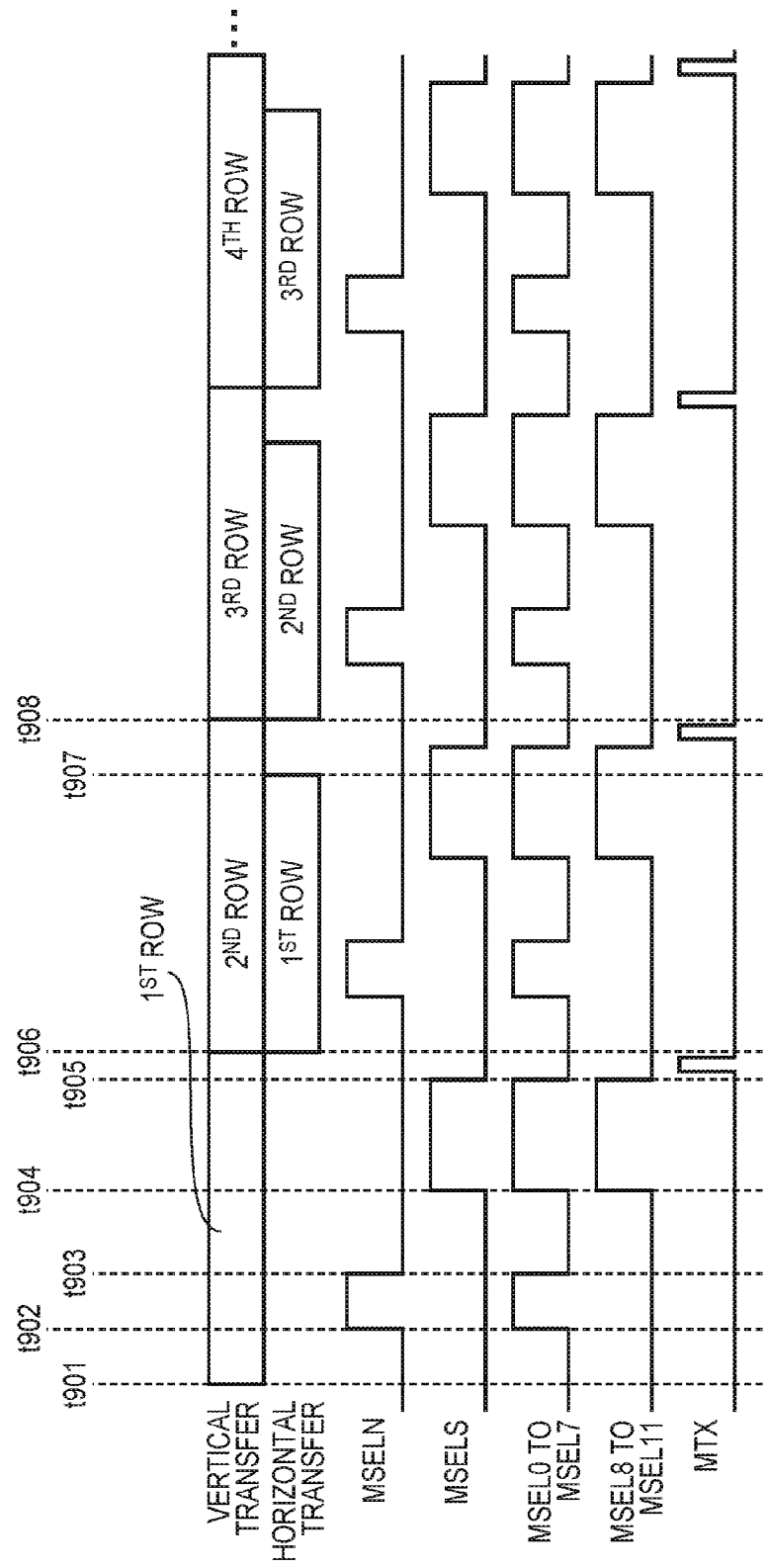
FIG. 10 shows a relationship between vertical transfer and horizontal transfer in the first driving mode according to the second embodiment.

FIG. 10 is a timing chart showing a relationship between vertical transfer and horizontal transfer in a first driving mode according to the second embodiment. From time t901 to time t906, vertical transfer for the first row is performed; this corresponds to the operations from time t501 to time t511 in the timing chart of FIG. 6.

In a period from time t902 to time t903, N conversion for the first row is performed; this corresponds to the operations from time t503 to time t504 of FIG. 6. At this time, as the selection signals MSELN and MSEL0 to MSEL7 are at the H level, the latch signal output from the comparison units 401 is supplied to bit0 to bit7 of each memory MN1 shown in FIG. 9. In the period of the N conversion, the count unit 407 supplies an 8-bit count signal to bit0 to bit7 of the memories MN1 via the count switching unit 806. Upon receiving the latch signal supplied from the comparison units 401, bit0 to bit7 of the memories MN1 store the count signal at that time as an N signal.

In a period from time t904 to time t905, S conversion for the first row is performed; this corresponds to the operations from time t507 to time t508 of FIG. 6. At this time, as the selection signals MSELS and MSEL0 to MSEL11 are at the H level, the latch signal output from the comparison units 401 is supplied to bit0 to bit11 of each memory MS1 shown in FIG. 9. In the period of the S conversion, the count unit 407 supplies a 12-bit count signal to bit0 to bit11 of the memories MS1 via the count switching unit 806. Upon receiving the latch signal supplied from the comparison units 401, bit0 to bit11 of the memories MS1 store the count signal at that time as an S signal.

Between time t905 and time t906, the transfer pulse signal MTX is placed at the H level, and the N signals and S signals stored in the memories MN1 and MS1 are transferred to the memories MN2 and MS2 of the readout memories 408, respectively.

From time t906 to time t908, vertical transfer for the second row is performed. In parallel with this vertical transfer, from time t906 to time t907, the N signals and S signals of the first row stored in the memories MN2 and MS2 of the readout memories 408 are sequentially output through horizontal transfer on a column-by-column basis. At this time, the horizontal transfer in the first driving mode is performed at an operating frequency that enables the horizontal transfer to be completed within a period of vertical transfer for the next row. Thereafter, similar operations are repeated until the last row, and then outputting of pixel signals is completed.

Figure 11:
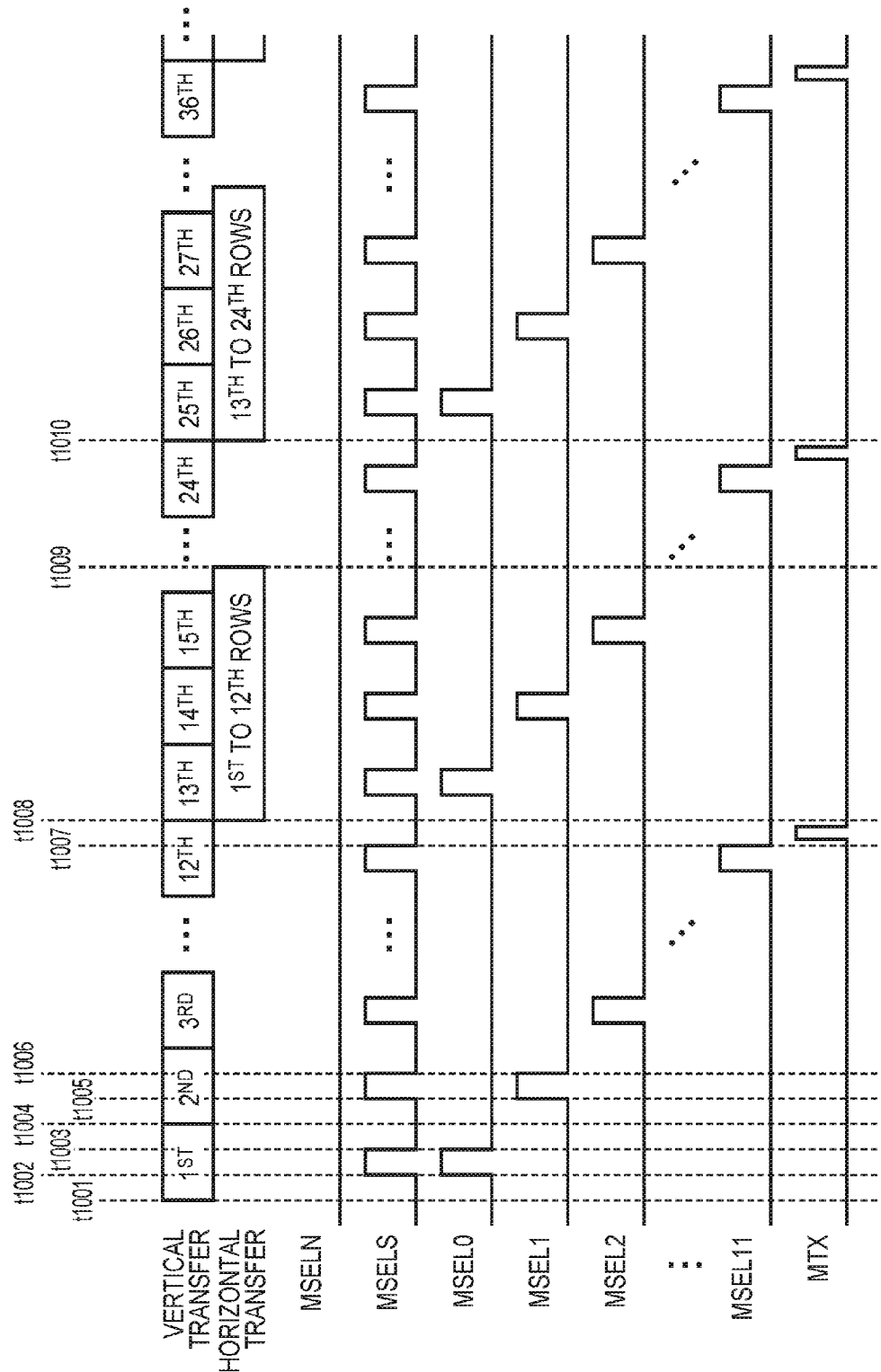
FIG. 11 shows a relationship between vertical transfer and horizontal transfer in the second driving mode according to the second embodiment.

FIG. 11 is a timing chart showing a relationship between vertical transfer and horizontal transfer in a second driving mode according to the second embodiment. From time t1001 to time t1004, vertical transfer for the first row is performed; this corresponds to the operations from time t601 to time t609 in the timing chart of FIG. 7.

In a period from time t1002 to time t1003, S conversion for the first row is performed; this corresponds to the operations from time t605 to time t606 of FIG. 7. At this time, as the selection signals MSELS and MSEL0 are at the H level, the latch signal output from the comparison units 401 is supplied only to bit0 of each memory MS1 shown in FIG. 9. In the period of the S conversion for the first row, the count unit 407 supplies a 1-bit count signal to bit0 of the memories MS1 via the count switching unit 806. Upon receiving the latch signal supplied from the comparison units 401, bit0 of the memories MS1 stores the count signal at that time as an S signal. Immediately after the S conversion from time t1002 to time t1003, the transfer pulse signal MTX remains at the L level unlike the timing chart of FIG. 7. Therefore, data transfer from the memories MS1 to the memories MS2 is not performed at this timing.

When S conversion for the second row is performed from time t1005 to time t1006, as the selection signals MSELS and MSEL1 are at the H level, the latch signal output from the comparison units 401 is supplied only to bit1 of each memory MS1 shown in FIG. 9. In the period of the S conversion for the second row, the count unit 407 supplies a 1-bit count signal to bit1 of the memories MS1 via the count switching unit 806. Upon receiving the latch signal supplied from the comparison units 401, bit1 of the memories MS1 stores the count signal at that time as an S signal. Similarly to the first row, the transfer pulse signal MTX remains at the L level; thus, data transfer to the memories MS2 is not performed at this timing, either. Similarly to the first and second rows, the S signals of the third to twelfth rows are sequentially stored to bit2 to bit11 of the memories MS1.

Upon completion of the S conversion for the twelfth row at time t1007, the transfer pulse signal MTX is placed at the H level, and the S signals of the first to twelfth rows stored in bit0 to bit11 of the memories MS1 are collectively transferred to the memories MS2.

Thereafter, from time t1008 to time t1010, vertical transfer for the thirteenth to twenty-fourth rows is performed. In parallel with this vertical transfer, from time t1008 to time t1009, the S signals of the first to twelfth rows stored in the memories MS2 of the readout memories 408 are collectively output through horizontal transfer. Thereafter, similar operations are repeated until the last row, and then outputting of pixel signals is completed.

Figure 12A:
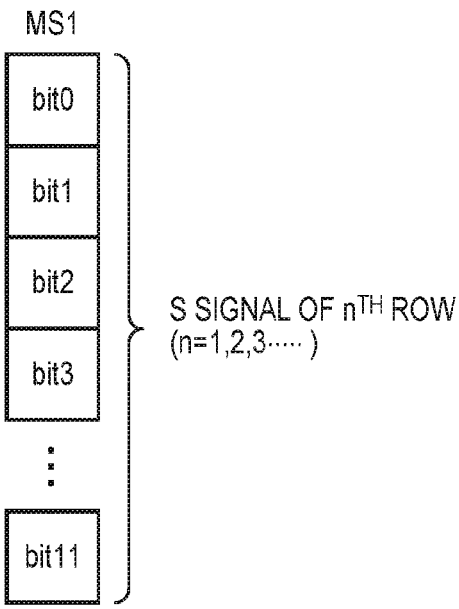
FIGS. 12A and 12B show data stored in the writing memories according to the second embodiment.
Figure 12B:
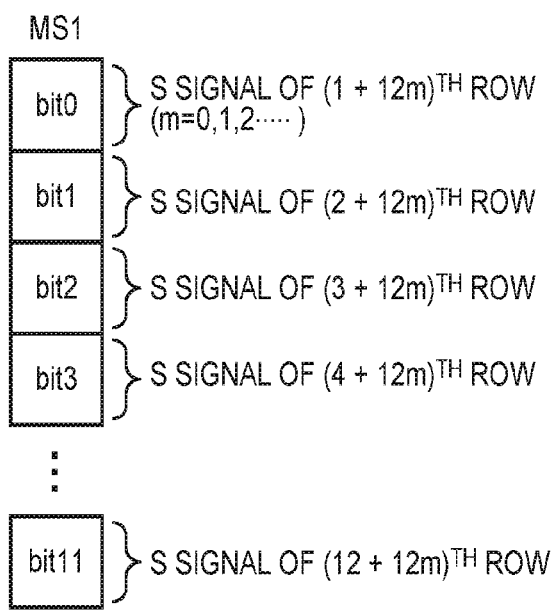

FIGS. 12A and 12B show data that is stored in the memories MS1 of the writing memories 405 in the first and second driving modes. In the first driving mode, data of a 12-bit S signal is stored in the memories MS1 on a row-by-row basis as shown in FIG. 12A. On the other hand, in the second driving mode, data of 1-bit S signals of twelve rows is collectively stored as shown in FIG. 12B. Then, the data of the S signals of twelve rows is collectively transferred.

Therefore, the second driving mode can perform collective horizontal transfer of S signals of twelve rows, and hence can accelerate the speed of horizontal transfer without increasing the operating frequency of horizontal transfer compared with the first driving mode.

The number of rows for which collective horizontal transfer is performed in the second driving mode need not be twelve as long as the following relationship is satisfied: a period of vertical transfer×n≥a period of horizontal transfer, where n is the number of rows for which collective horizontal transfer is performed.

Third Embodiment

The third embodiment has a third driving mode for outputting pixel signals after applying thereto AD conversion with a resolution of 3 bits, in addition to a first driving mode for outputting pixel signals after applying thereto AD conversion with a resolution of 12 bits, and a second driving mode for outputting pixel signals after applying thereto AD conversion with a resolution of 1 bit. The configuration of an image capturing apparatus and methods of driving in the first and second driving modes according to the third embodiment are similar to those according to the second embodiment, and thus a description thereof will be omitted.

Figure 13:
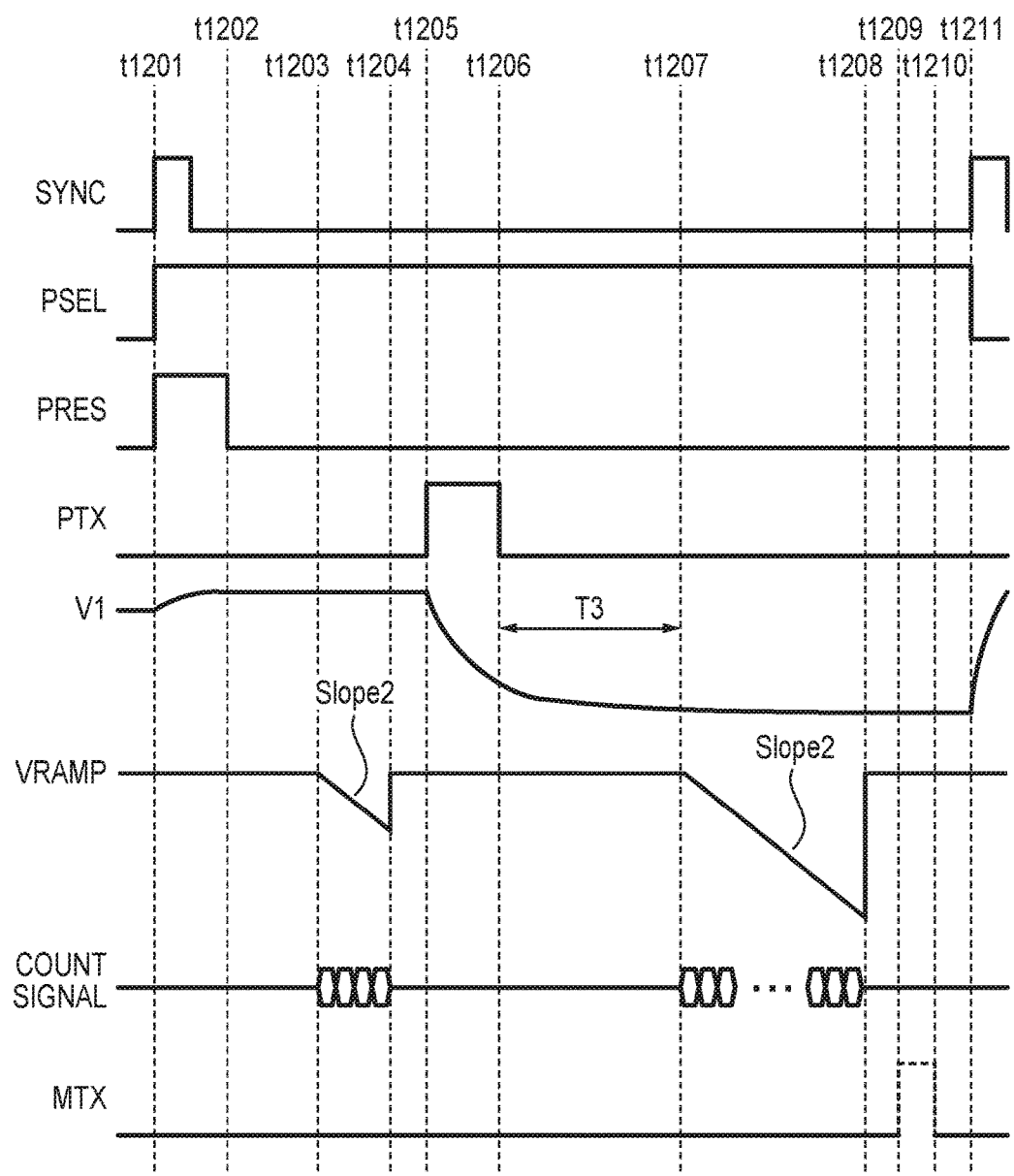
FIG. 13 is a timing chart showing driving for readout in a third driving mode according to a third embodiment.
Figure 14:
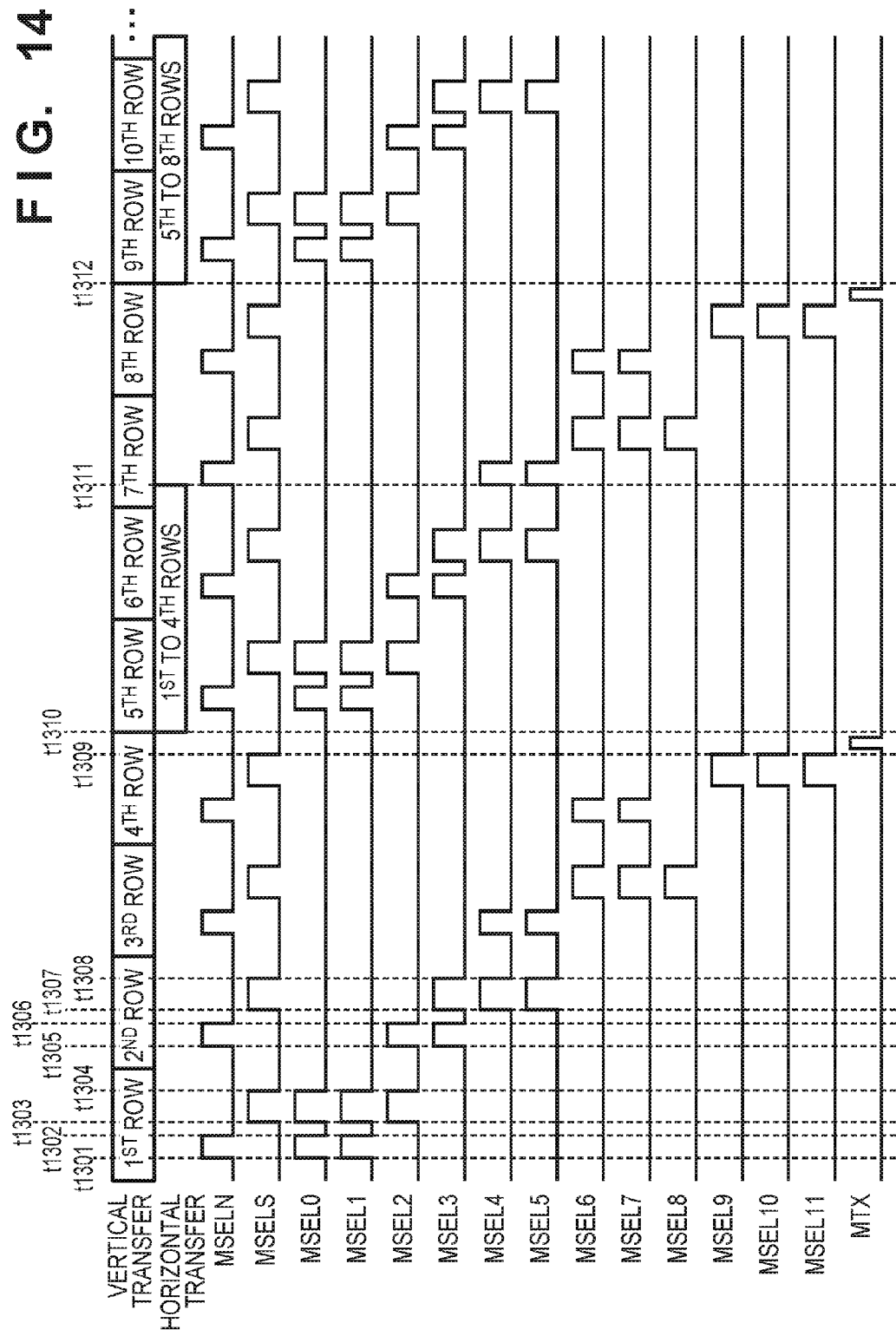
FIG. 14 shows a relationship between vertical transfer and horizontal transfer in the third driving mode according to the third embodiment.

Using FIGS. 13 and 14, the following describes timings of driving in the third driving mode for outputting pixel signals after applying thereto AD conversion with a resolution of 3 bits. FIG. 13 is a timing chart showing timings of driving for readout from a certain row selected by the vertical scanning circuit 203 in the third driving mode.

The operations from time t1201 to time t1203 are similar to the operations from time t501 to time t503 in the first driving mode, which are shown in FIG. 6, and thus a description thereof will be omitted. From time t1203 to time t1204, N conversion is performed.

At time t1203, the VRAMP signal supplied from the reference signal generation unit 402 starts changing with time at an inclination of Slope2, which exhibits a larger temporal change than Slope1 of FIG. 6. Between time t1203 and time t1204, the count unit 407 performs a count operation corresponding to 2 bits, and outputs a 2-bit count signal to the writing memories 405. Specifically, at time t1203, the comparison units 401 start an operation of comparing the N signals input via the storage capacitors 403 with the VRAMP signal input via the storage capacitors 404. When the magnitude relationship between the N signals and the VRAMP signal is reversed, the comparison units 401 output the latch signal to the writing memories 405. Then, the writing memories 405 store the supplied count signal as a digital N signal. Bits of the writing memories 405 that store N signals will be described using FIG. 14.

From time t1205 to time t1206, the transfer pulse signal PTX is placed at the H level. Accordingly, the transfer switches 302 of the pixels are turned ON, and signal charges generated by the photodiodes 301 through photoelectric conversion are transferred to the FDs 303. S signals are output to the column output lines 207, and the potential V1 of the column output lines 207 starts changing.

After a stabilization period T3 has elapsed, S conversion is performed from time t1207 to time t1208. In the S conversion, the S signals stored in the storage capacitors 403 are converted into digital signals. At time t1207, the VRAMP signal supplied from the reference signal generation unit 402 starts changing with time at an inclination of Slope2 as in the N conversion. Between time t1207 and time t1208, the count unit 407 performs a count operation corresponding to 3 bits, and outputs a 3-bit count signal to the writing memories 405. Specifically, at time t1207, the comparison units 401 start an operation of comparing the S signals with the VRAMP signal. When the magnitude relationship between the S signals and the VRAMP signal is reversed, the comparison units 401 output the latch signal to the writing memories 405. Then, the writing memories 405 store the supplied count signal as a digital S signal. Bits of the writing memories 405 that store S signals will be described using FIG. 14. This S conversion is performed with a resolution of 3 bits.

From time t1209 to time t1210, the transfer pulse signal MTX is placed at the H level only for a predetermined row. As a result, the memory-to-memory transfer switches 406 are turned ON, and the digital S signals and N signals of a plurality of rows stored in the writing memories 405 are transferred to the readout memories 408. The details of this operation will be described using FIG. 14. At time t1211, the horizontal synchronization pulse signal SYNC is placed at the H level again, and vertical transfer for the next row is started.

The resolution of AD conversion in the third driving mode is higher than that in the second driving mode, and lower than that in the first driving mode. Therefore, the stabilization period T3 for the potential V1 of the column output lines in the third driving mode and the stabilization periods T1 and T2 shown in FIGS. 6 and 7 satisfy the relationship T1>T3>T2.

The third driving mode can thus output low-resolution digital signals at high speed by shortening the period of AD conversion and the stabilization period compared with the first driving mode. Furthermore, a stabilization period for the column output lines that extends from time t1202 to time t1203 after cancellation of the resetting in FIG. 13 can be shorter than a corresponding period from time t502 to time t503 in the first driving mode in FIG. 6.

FIG. 14 is a timing chart showing a relationship between vertical transfer and horizontal transfer in the third driving mode. In a period from time t1301 to time t1302, N conversion is performed through vertical transfer for the first row; this corresponds to the operations from time t1203 to time t1204 in the timing chart of FIG. 13. At this time, as the selection signals MSELN, MSEL0, and MSEL1 are at the H level, the latch signal output from the comparison units 401 is supplied to bit0 and bit1 of each memory MN1 shown in FIG. 9. In the period of the N conversion for the first row, the count unit 407 supplies a 2-bit count signal to bit0 and bit1 of the memories MN1 via the count switching unit 806. Upon receiving the latch signal supplied from the comparison units 401, bit0 and bit1 of the memories MN1 store the count signal at that time as an N signal.

In a period from time t1303 to time t1304, S conversion is performed through vertical transfer for the first row; this corresponds to the operations from time t1207 to time t1208 in the timing chart of FIG. 13. At this time, as the selection signals MSELS and MSEL0 to MSEL2 are at the H level, the latch signal output from the comparison units 401 is supplied to bit0 to bit2 of each memory MS1 shown in FIG. 9. In the period of the S conversion for the first row, the count unit 407 supplies a 3-bit count signal to bit0 to bit2 of the memories MS1 via the count switching unit 806. Upon receiving the latch signal supplied from the comparison units 401, bit0 to bit2 of the memories MS1 store the count signal at that time as an S signal.

Immediately after the S conversion from time t1303 to time t1304, the transfer pulse signal MTX remains at the L level. Therefore, data transfer from the memories MS1 to the memories MS2 is not performed at this timing.

When N conversion for the second row is performed from time t1305 to time t1306, as the selection signals MSELN, MSEL2, and MSEL3 are at the H level, the latch signal output from the comparison units 401 is supplied to bit2 and bit3 of the memories MS1. In the period of the N conversion for the second row, the count unit 407 supplies a 2-bit count signal to bit2 and bit3 of the memories MN1 via the count switching unit 806. Upon receiving the latch signal supplied from the comparison units 401, bit2 and bit3 of the memories MN1 store the count signal at that time as an N signal.

When S conversion for the second row is performed from time t1307 to time t1308, as the selection signals MSELS and MSEL3 to MSEL5 are at the H level, the latch signal output from the comparison units 401 is supplied to bit3 to bit5 of the memories MS1. In the period of the S conversion for the second row, the count unit 407 supplies a 3-bit count signal to bit3 to bit5 of the memories MS1 via the count switching unit 806. Upon receiving the latch signal supplied from the comparison units, bit3 to bit5 of the memories MS1 store the count signal at that time as an S signal.

Similarly, N signals of the third row are stored to bit4 and bit5 of the memories MN1, and N signals of the fourth row are stored to bit6 and bit7 of the memories MN1. Furthermore, S signals of the third row are stored to bit6 to bit8 of the memories MS1, and S signals of the fourth row are stored to bit9 to bit11 of the memories MS1.

Thereafter, between time t1309 to time t1310, the transfer pulse signal MTX is placed at the H level, and the N signals and S signals of the first to fourth rows stored in the memories MN1 and MS1 are collectively transferred to the memories MN2 and MS2.

Then, from time t1310 to time t1312, vertical transfer for the fifth to eighth rows is performed. In parallel with this vertical transfer, from time t1310 to time t1311, the N signals and S signals of the first to fourth rows stored in the memories MN2 and MS2 are collectively output through horizontal transfer. Thereafter, similar operations are repeated until the last row, and then outputting of pixel signals is completed.

Figure 15:
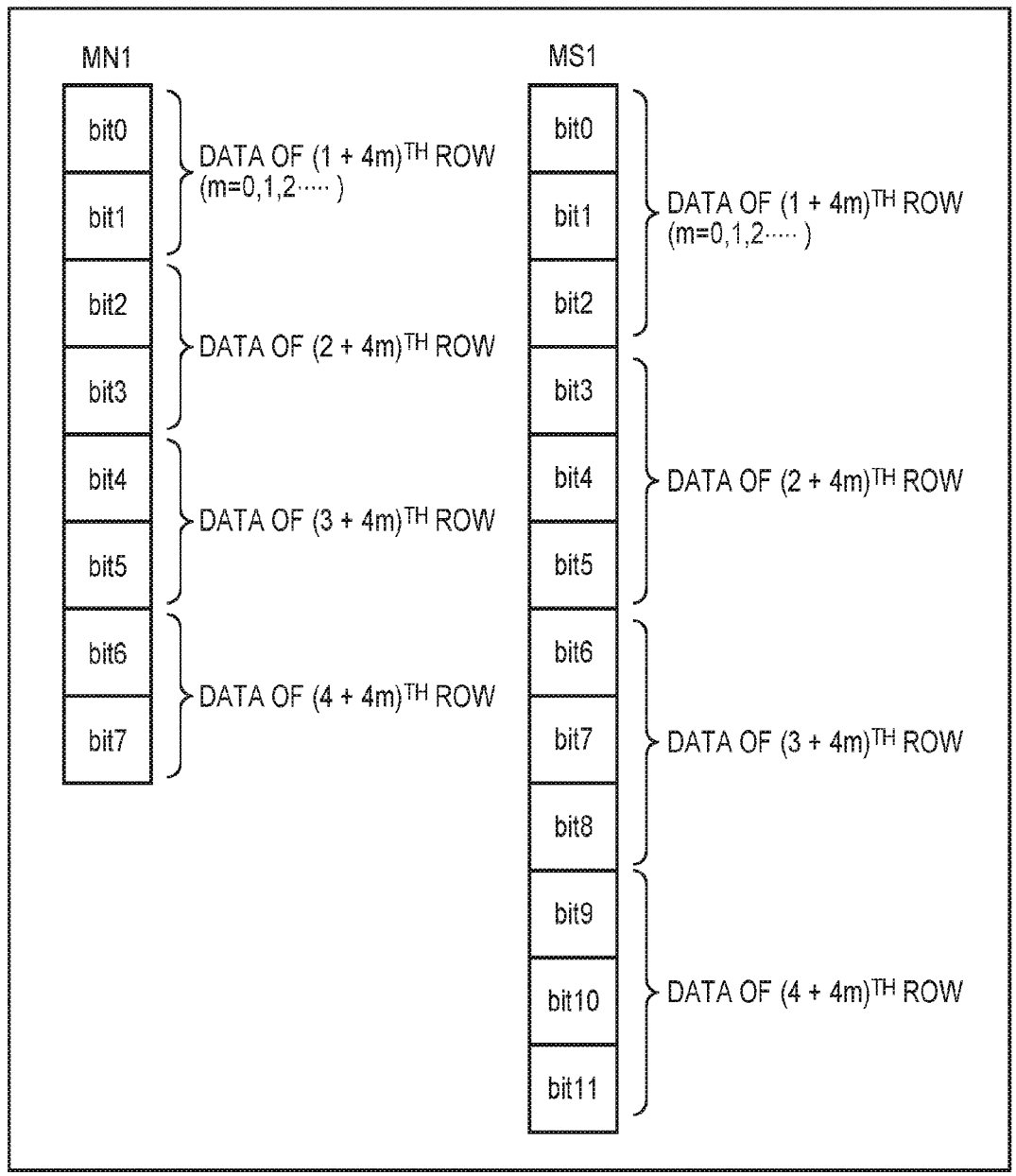
FIG. 15 shows data stored in writing memories in the third driving mode according to the third embodiment.

FIG. 15 shows data that is stored in the memories MN1 and MS1 of the writing memories 405 in the third driving mode. As shown in FIG. 15, each memory MN1 stores data of 2-bit N signals of four rows, and each memory MS1 stores data of 3-bit S signals of four rows. These signals are collectively transferred to the readout memories 408, and output through horizontal transfer. Therefore, the third driving mode can perform collective horizontal transfer of N signals and S signals of four rows, and hence can accelerate the speed of horizontal transfer without increasing the operating frequency of horizontal transfer compared with the first driving mode.

As described above, in the third driving mode, as AD conversion is performed with a lower resolution than AD conversion performed in the first driving mode, the period of the S conversion can be shortened, the stabilization period for the column output lines can be shortened, and the period until the start of AD conversion can be shortened. Therefore, digital signals with a low resolution can be output at high speed.

Fourth Embodiment

The fourth embodiment introduces an example in which an image capturing apparatus according to the above-described embodiments is applied to an onboard camera. An image capturing apparatus applied to an onboard camera is used for various purposes and has, for example, a recording mode in which the image capturing apparatus functions as a dashcam to record images, a lane detection mode for detecting a lane from captured images and issuing a lane departure warning, and an illuminance detection mode for detecting the external illuminance from captured images and controlling the headlight and the like.

For example, in the lane detection mode, straight lines and curve lines are detected as lane markings by applying processing, such as the Hough transform, to images that have been binarized using a predetermined threshold. To detect a lane while running on a highway, an image sensor needs to output images at high speed. In this case, the image sensor can further increase its output speed by outputting images after binarizing the images. On the other hand, in the recording mode, the image sensor needs to output high-resolution images to record high-quality images. In the illuminance detection mode, the resolution of images need not be as high as the resolution of images in the recording mode.

In view of this, an image capturing apparatus according to the present embodiment can switch among the first to third driving modes described in the first to third embodiments in accordance with an image capture mode.

Figure 16:
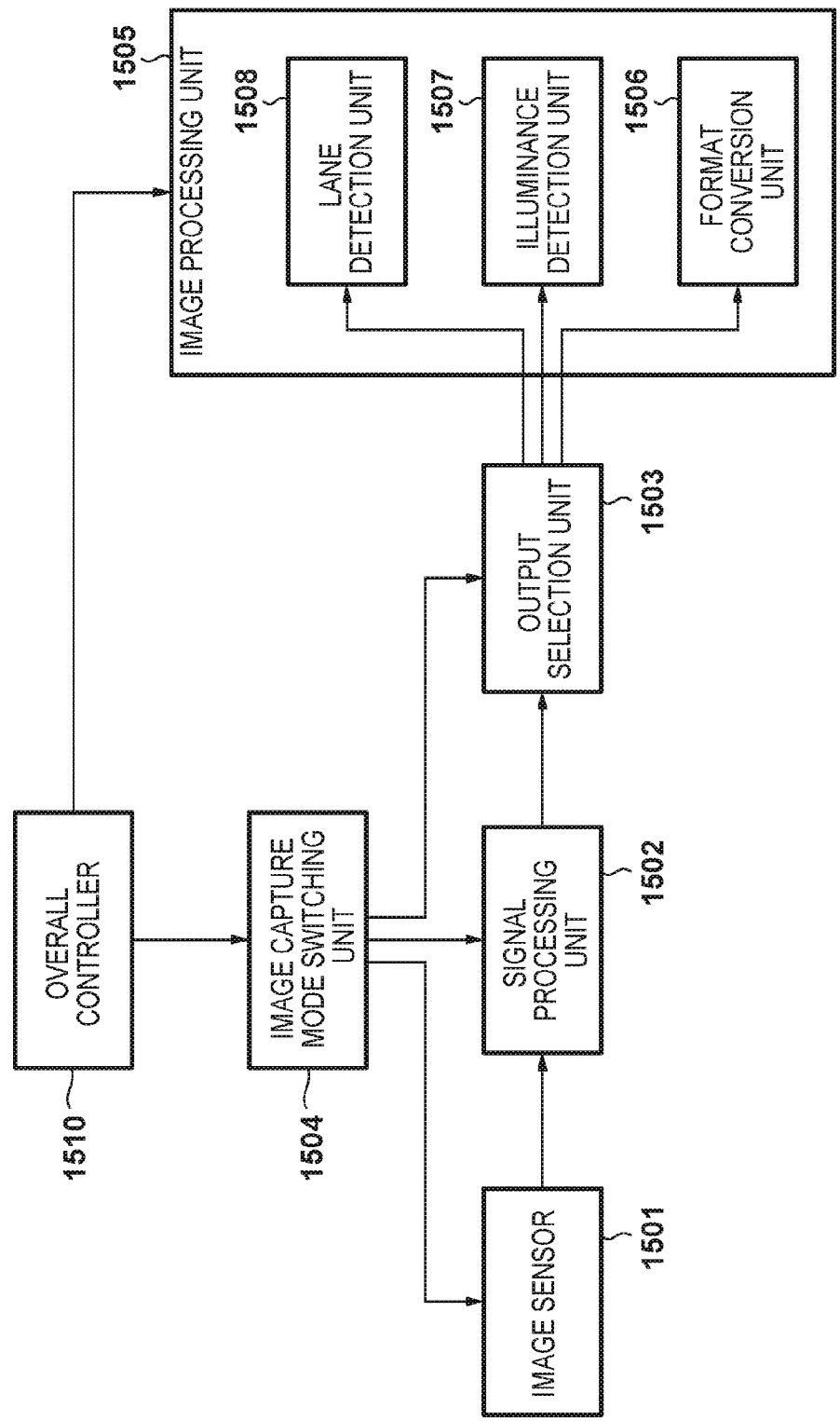
FIG. 16 shows a configuration of the image capturing apparatus applied to an onboard camera.

FIG. 16 shows a configuration of an image capturing apparatus according to the first to third embodiments that is applied to an onboard camera. An image sensor 1501 outputs image signals by photoelectrically converting an object image formed by a non-illustrated photographing lens. The image sensor 1501 is the same as the image sensor 100 shown in FIG. 1. The image sensor 1501 has the first to third driving modes described in the first to third embodiments, and is driven in these modes based on a signal from an image capture mode switching unit 1504. The image capture mode switching unit 1504 switches among the driving modes of the image sensor 1501 in accordance with a signal from an overall controller 1510.

In accordance with the first to third driving modes, a signal processing unit 1502 applies various types of correction to image signals output from the image sensor 1501. An image processing unit 1505 includes a format conversion unit 1506, an illuminance detection unit 1507, and a lane detection unit 1508. The format conversion unit 1506 converts input image signals into a predetermined moving image format, and records the resultant image signals to a non-illustrated recording unit. The illuminance detection unit 1507 calculates an integrated value of a predetermined range of the input image signals, and detects the external illuminance based on the integrated value. The lane detection unit detects straight lines and curve lines as lane markings by applying processing, such as the Hough transform, to input image signals.

In accordance with a signal from the image capture mode switching unit 1504, an output selection unit 1503 switches among blocks of the image processing unit 1505 to select one of the blocks as a destination of image signals output from the image processing unit 1502. For example, image signals obtained through image capture in the first driving mode, which outputs pixel signals after applying thereto AD conversion with a resolution of 12 bits, are output to the format conversion unit 1506, converted into the moving image format, and recorded. Image signals obtained through image capture in the second driving mode, which outputs pixel signals after applying thereto AD conversion with a resolution of 1 bit, are output to the lane detection unit 1508 and used in lane detection. Image signals obtained through image capture in the third driving mode, which outputs pixel signals after applying thereto AD conversion with a resolution of 3 bits, are output to the illuminance detection unit 1507 and used in illuminance detection.

As described above, by switching among the plurality of driving modes that perform AD conversion with different resolutions in accordance with an intended use of image signals, high-resolution image signals can be output when high image quality is required, and low-resolution image signals can be output at high speed when high-speed processing is required. Switching among the above-described driving modes may be performed in response to an instruction from a user, or may be performed on a frame-by-frame basis. A plurality of image sensors may be installed in an onboard camera, and switching among driving modes of each image sensor may be performed in accordance with an intended use.

Although the embodiments of the present invention have been described thus far, the present invention is not limited to these embodiments, and can be modified in various ways without departing from the principles of the present invention.

Other Embodiments

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2016-123990, filed Jun. 22, 2016 which is hereby incorporated by reference herein in its entirety.

What is claimed is:

1. An image capturing apparatus, comprising:
a plurality of pixels arranged in a matrix, each pixel including a photoelectric conversion portion;
an AD converter that converts the analog signals output from the plurality of pixels into digital signals; and
a controller that sets one of a first mode and a second mode, wherein the AD converter converts the analog signals into the digital signals with a resolution of n bits in the first mode and the AD converter converts the analog signals into the digital signals with a resolution of m bits in the second mode, n being an integer larger than or equal to two, m being a positive integer smaller than n,
wherein each pixel includes:
a charge-to-voltage converter that converts signal charges generated by the photoelectric conversion portion into voltage signals,
a transfer portion that transfers the signal charges generated by the photoelectric conversion portion to the charge-to-voltage converter,
an amplification portion that amplifies a voltage corresponding to an amount of charges in the charge-to-voltage converter and outputs the amplified voltage to the column output line, and
a reset portion that resets the charge-to-voltage converter, and
wherein in the first mode, first signals and second signals are output from the plurality of pixels and a processing that the first signals are subtracted from the second signals is performed, the first signals being output from the plurality of pixels in a state where the charge-to-voltage converters have been reset, the second signals being output from the plurality of pixels in a state where the signal charges generated by the photoelectric conversion portions have been transferred to the charge-to-voltage converters, and
wherein in the second mode, only the second signals are output from the plurality of pixels and the processing that the first signals are subtracted from the second signals is not performed.

2. The image capturing apparatus according to claim 1, further comprising a column output line to which the plurality of pixels output analog signals on a column-by-column basis,
wherein in the second mode, the controller shortens a waiting period in which stabilization of a voltage corresponding to signals of the plurality of pixels is waited for, the voltage appearing in the column output line.

3. The image capturing apparatus according to claim 1, further comprising
a memory that stores the digital signals converted by the AD converter.

4. The image capturing apparatus according to claim 3, further comprising
a horizontal scanning circuit that sequentially outputs, on a column-by-column basis, the digital signals stored in the memory.

5. The image capturing apparatus according to claim 1, wherein
in the second mode, the AD converter converts the second signals into the digital signals with a resolution of 1 bit.

6. The image capturing apparatus according to claim 1, wherein
the setting unit sets the first mode in a case where high image quality is required, and sets the second mode in a case where high-speed processing is required.

7. The image capturing apparatus according to claim 6, wherein
the setting unit sets the first mode in capturing an image, and sets the second mode in detecting defects in the plurality of pixels or dust adhering to the plurality of pixels.

8. A method of controlling an image capturing apparatus including a plurality of pixels arranged in a matrix and an AD converter that converts analog signals output from the plurality of pixels into digital signals, each pixel including a photoelectric conversion portion, the method comprising:
controlling one of a first mode and a second mode, wherein the AD converter converts the analog signals into the digital signals with a resolution of n bits in the first mode and the AD converter converts the analog signals into the digital signals with a resolution of m bits in the second mode, n being an integer larger than or equal to two, m being a positive integer smaller than n,
wherein each pixel includes:
a charge-to-voltage converter that converts signal charges generated by the photoelectric conversion portion into voltage signals,
a transfer portion that transfers the signal charges generated by the photoelectric conversion portion to the charge-to-voltage converter,
an amplification portion that amplifies a voltage corresponding to an amount of charges in the charge-to-voltage converter and outputs the amplified voltage to the column output line, and
a reset portion that resets the charge-to-voltage converter, and
wherein in the first mode, first signals and second signals are output from the plurality of pixels and a processing that the first signals are subtracted from the second signals is performed, the first signals being output from the plurality of pixels in a state where the charge-to-voltage converters have been reset, the second signals being output from the plurality of pixels in a state where the signal charges generated by the photoelectric conversion portions have been transferred to the charge-to-voltage converters, and
wherein in the second mode, only the second signals are output from the plurality of pixels and the processing that the first signals are subtracted from the second signals is not performed.

* * * * *